US009779824B2

(12) United States Patent
Missiroli

(10) Patent No.: US 9,779,824 B2
(45) Date of Patent: Oct. 3, 2017

(54) NAND FLASH MEMORY COMPRISING CURRENT SENSING PAGE BUFFER

(71) Applicant: SK hynix Inc., Gyeonggi-do (KR)

(72) Inventor: Chiara Missiroli, Agrate Bria (IT)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/432,147

(22) Filed: Feb. 14, 2017

(65) Prior Publication Data
US 2017/0243653 A1 Aug. 24, 2017

(30) Foreign Application Priority Data
Feb. 22, 2016 (IT) .................... 102016000018085

(51) Int. Cl.
G11C 16/04 (2006.01)
G11C 16/24 (2006.01)
G11C 16/26 (2006.01)

(52) U.S. Cl.
CPC .............. G11C 16/24 (2013.01); G11C 16/26 (2013.01)

(58) Field of Classification Search
USPC .......................... 365/185.17, 185.18, 185.25
See application file for complete search history.

(56) References Cited

U.S. PATENT DOCUMENTS

| 2005/0226046 | A1* | 10/2005 | Lee ..................... G06F 12/0893 365/185.12 |
| 2006/0221739 | A1 | 10/2006 | Kim |
| 2008/0247241 | A1 | 10/2008 | Nguyen et al. |
| 2012/0213008 | A1* | 8/2012 | Choi ..................... G11C 16/26 365/185.21 |
| 2013/0010543 | A1* | 1/2013 | Martinozzi ............ G11C 16/10 365/189.05 |
| 2014/0355354 | A1 | 12/2014 | Ahn |
| 2016/0005490 | A1 | 1/2016 | Shim |

OTHER PUBLICATIONS

Extended Search Report Issued by Italian Patent office dated Oct. 28, 2016.

* cited by examiner

*Primary Examiner* — Vu Le
(74) *Attorney, Agent, or Firm* — IP & T Group LLP

(57) ABSTRACT

Disclosed herein is a NAND flash memory comprising a bit-line and a page buffer, the page buffer comprising: a first switching circuit arranged between a first node and the bit-line; a third switching circuit arranged between the first node and a sensing node and configured to discharge the sensing node during an evaluation period, a pre-charging period preceding the evaluation period; and a fourth switching circuit configured to provide a first pre-charging path to the bit-line through the first node and the first switching circuit from a first voltage source during the pre-charging period, wherein the sensing node is configured to be charged through a second pre-charging path during the pre-charging period, and the second pre-charging path is separated from the first pre-charging path by the third switching circuit during the pre-charging period.

20 Claims, 8 Drawing Sheets

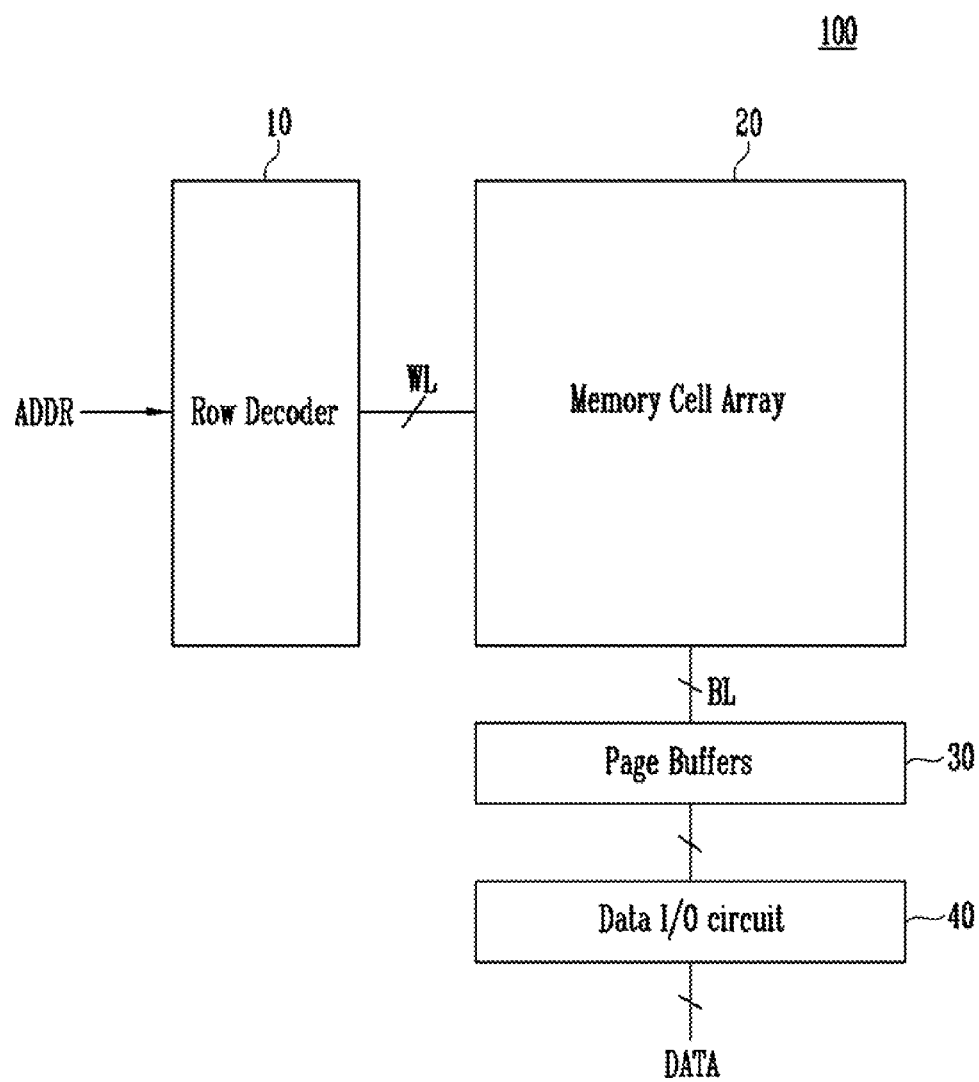

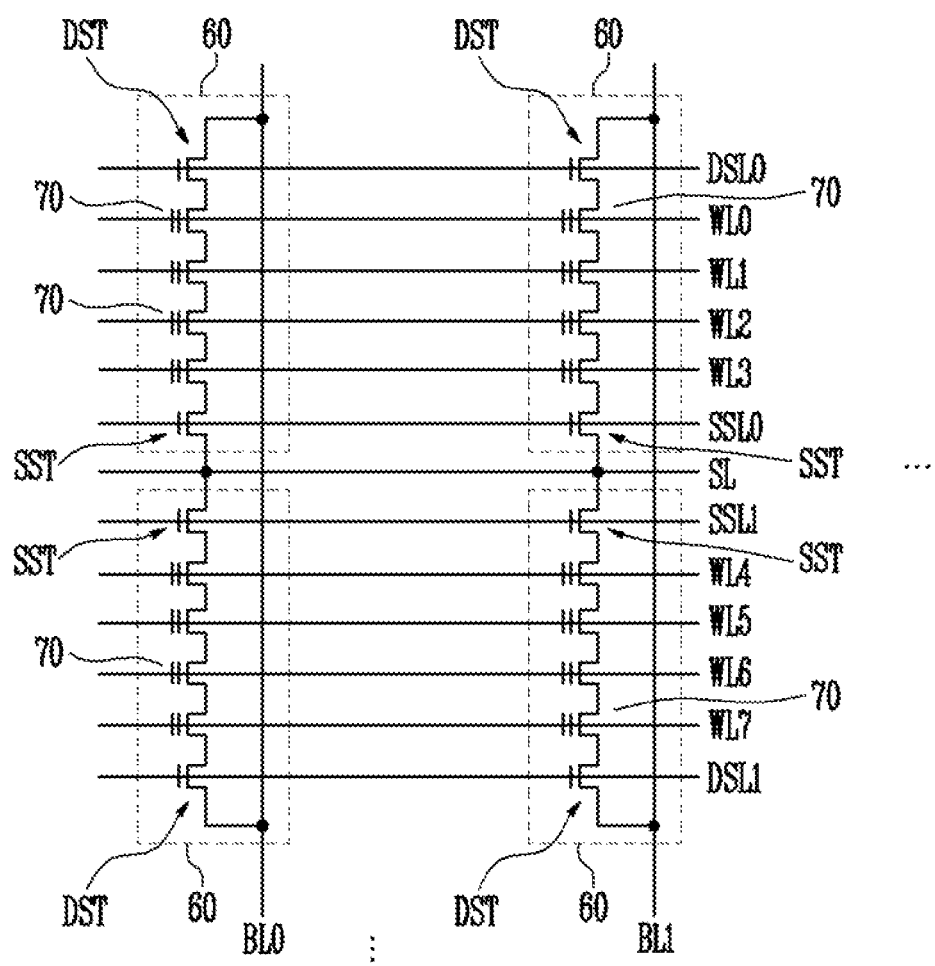

US 9,779,824 B2

NAND FLASH MEMORY COMPRISING CURRENT SENSING PAGE BUFFER

CROSS-REFERENCE TO RELATED APPLICATION

The present application claims priority under 35 U.S.C. §119(a) to Italian patent application number 102016000018085, filed on Feb. 22, 2016, the entire disclosure of which is incorporated herein by reference in its entirety.

BACKGROUND

Field of Invention

The present disclosure relates generally to a NAND flash memory comprising a current sensing page buffer, and a controlling method thereof.

More particularly, the present disclosure relates to a NAND flash memory comprising an improved current sensing page buffer capable of controlling a sensing current more precisely.

Description of Related Art

Among various types of flash memory devices, NAND-type flash memory devices are increasingly used as high capacity data storage media. Each cell of a flash memory can be programmed to store information by trapping charges, e.g., electrons in the cell by exploiting, for example the Fowler-Nordheim tunneling effect. A control gate of a flash memory cell is connected to a word-line of the flash memory, and a voltage may be provided to the control gate through the word-line. A flash memory cell may be a single level memory cell (SLC) capable of storing a single bit, or a multiple level memory cell (MLC) capable of storing multiple bits. In both an SLC and an MLC, the information stored therein is defined by a corresponding threshold voltage of the memory cell.

FIG. 1A is a simplified block diagram of a conventional NAND flash memory device 100. The flash memory device 100 comprises a memory cell array 20, a page buffer block 30, a data input/output circuit 40 and a row decoder 10. The memory cell array 20 is connected to the page buffer block 30 through bit-lines BL and is connected to the row decoder 10 through word-lines WL and other conductive lines. The conductive lines may be, for example, drain selection lines or source selection lines for addressing specific cell strings of the memory cell array. The memory cell array 20 includes a plurality of cell strings, each including a plurality of memory cells. Each memory cell, i.e., the floating gate of each memory cell transistor, may store data transferred from the page buffer block 30 with the control of the row decoder 10, and transfers the stored data to the page buffer block 30 with the control of the row decoder 10. Memory cells are arranged at intersections of the plurality of bit-lines BL and the plurality of word-lines WL, respectively.

The page buffer block 30 may be connected to the memory cell array 20 and to the data input/output circuit 40 through the bit-lines BL. The page buffer block 30 may drive the bit-lines BL during program, read, and erase operations, and may sense the data stored in each memory cell of the memory cell array 20 during the read operation. The data input/output circuit 40 may also exchange data DATA with an external device. The data input/output circuit 40 may transfer write data received from an external device to the page buffer block 30 before a writing operation and may also transfer read data from the memory cell array 20 to the external device. The data input/output circuit 40 may include a data buffer and a column pass gate, which are well known in the art.

The row decoder 10 is connected to the memory cell array 20. The row decoder 10 may select any one of the word-lines WL1 to WLm based on a received external address. The row decoder 10 may also drive the source selection line and the drain selection line of a cell string to which the addressed cells belong to. The row decoder 10 may apply various voltages such as a program voltage, a pass voltage a read voltage, and a ground voltage, to the word-lines WL as may be needed according to an operation mode.

FIG. 1B is an exemplary block diagram of the memory cell array 20 of FIG. 1A.

The block diagram of FIG. 1B is explained herewith for ease of understanding of an exemplary conventional structure of a NAND flash memory, and not for limiting the invention to this specific scheme. For example, a 3D NAND technology may adopt a different scheme than that shown in FIG. 1B.

The memory cell array 20 includes a plurality of blocks 50. Each block 50 includes a plurality of cell strings 60. Each cell string 60 includes a plurality of memory cells in which data is stored. Memory cells are arranged at intersections of the plurality of bit-lines BL0 to BLm and the plurality of word-lines WL0 to WLr+k−1, respectively. Strings can be selected or deselected by a drain selection line, e.g. DSL0, DSLj, and DSLn, and by a source selection line, e.g. SSL0, SSLj, and SSLn. It is understood that the bit-lines BL0 to BLm of the memory cell array 20 are connected to the page buffer block 30 and the word-lines WL, drain selection lines DSL and source selection lines SSL are connected to the row decoder 10.

FIG. 1C shows an exemplary structure of some cell strings and respective memory cells in the memory cell array of FIG. 1B.

Specifically, FIG. 1C shows four cell strings 60. Each cell string 60 includes a plurality of memory cells 70 in which data is stored, e.g., in the floating gates of the memory cells. In the example of FIG. 1C, one cell string 60 includes four memory cells 70 arranged in series, but it should be understood that the number of the memory cells included in a cell string may vary depending on implementation. Memory cells 70 are arranged at intersections of the plurality of bit-lines BL0 and BL1 and the plurality of word-lines WL0 to WL7, respectively. The number of word lines may be different in various embodiments of the memory cell array. Cell strings can be selected or deselected by controlling the drain selection lines, e.g. DSL0 and DSL1, and by controlling the source selection lines, e.g. SSL0 and SSL1. Bit-lines BL0 and BL1 of the memory cell array 20 are connected to the page buffer block 30. Word-lines WL0 to WL7, drain selection lines DSL0 and DSL1 and source selection lines SSL0 and SSL1 are connected to the row decoder 10.

The gate of the drain select transistor DST of each cell string is connected to a drain selection line, e.g., the DSL0 or the DSL1. The gate of the source select transistor SST of each string is connected to a source selection line, e.g., the SSL0 or the SSL1. The source select transistor SST connects each string to a source line SL, and can be switched on or off. In order to couple a specific cell string to its bit-line, a high voltage can be driven to the gates of the SST and DST of the cell string to switch them on. Due to the drain select transistor DST, the source select transistor SST, the source selection line SSL and the drain selection line DSL, specific strings belonging to a same row can be specifically addressed to carry out an operation such as a programming, an erase, and a read operation. The other strings not selected for the operation can be de-coupled from the bit-lines by driving low voltage to the gates of the drain and source select transistors DST and SST of those strings.

Meanwhile, the architecture of NAND memory devices is driven from market requirements towards the introduction of an all-bit-line (ABL) scheme in order to reduce a floating gate to floating gate (FG-to-FG) coupling effect during programming and satisfy large page size needs. The adoption of an ABL scheme has led to the development of a sensing scheme suitable to the concurrent reading of all cells of a physical word-line. A traditional charge integration sensing scheme, also known as "voltage sensing", required the alternate reading of cells connected to even and odd bit-lines so as to provide bit-line to bit-line shielding by grounding unselected bit-lines. A recent sensing scheme, known as "current sensing," provides a reliable reading of even and, odd bit-lines at the same time, thus requiring a single reading step for both. The current sensing scheme provides the advantage of reading all cells of a physical word-line at the same time and thus effectively doubling the page size. According to the current sensing scheme, it is also possible to verify all cells of a word-line concurrently, which also improves program performance, both in throughput and reliability. Moreover, since all cells of a word-line are programmed in parallel, the cell to cell interference is minimized. As a drawback, the current sensing scheme generally adopted in existing ABL architectures causes a less efficient control of the read current and a greater variation on the parameters which have to be tightly controlled to ensure a wider read margin between distributions.

FIG. 2 shows a conventional page buffer circuit 30 suitable to perform a current sensing operation according to the current sensing scheme.

The page buffer 30 comprises a first node CSO and a sensing node SEN. The bit-line BL extends to the memory cell array 20. A first transistor M1 is arranged between the first node CSO and the bit-line BL. The first transistor M1 is configured to pre-charge the bit-line BL based on a voltage PB_SENSE, more specifically with voltage PB_SENSE minus a gate-source threshold voltage of the first transistor M1. A second transistor M2 is configured to prevent the voltage level of the first node CSO from being lower that the voltage level of SA_CSOC minus a gate-source threshold voltage of the second transistor M2. A third transistor M3 is arranged between the first node CSO and the sensing node SEN. The third transistor M3 connects the first node CSO with the sensing node SEN.

The operation of the page buffer circuit 30 will be explained in reference to FIGS. 2 and 3. FIG. 3 shows a timing diagram of the page buffer circuit 30 performing the current sensing operation. One cycle of the current sensing operation comprises six periods, i.e., a pre-charging period t1, a first evaluation period t2, a first strobe period t3, a recovery period t4, a second evaluation period t5, and a second strobe period t6.

In the pre-charging period t1, firstly, a sense latch 31 is reset so that a node QS has a low voltage level, and then all bit-lines BLs are pre-charged at the same time by raising voltage PB_SENSE to the desired bit-line level plus the gate-source threshold voltage of the first transistor M1. A pre-charge path is powered through third and seventh transistors M3 and M7. The seventh transistor M7 is coupled between the sense node SEN and the drain of a sixth transistor M6 the source of which s coupled to a voltage terminal VCORE. The gate of the sixth transistor M6 is coupled to the QS node. Voltages SA_PRECH and SA_SENSE which are provided to the gates of the third and seventh transistors M3 and M7, respectively, are set to at least the level of a power supply voltage VDC_PB plus a threshold voltage VTH. At the same time, a second transistor M2 gated by a voltage SA_CSOC is enabled by raising a gate voltage SA_CSOC to a level higher than the PB_SENSE voltage. For, example, the SA_CSOC may be raised to 1.4V when the PB_SENSE voltage is set to 1.2V. These voltages are applied for the pre-charging period t1 which is sufficient to pre-charge the bit-lines. Also, the first node CSO and the sensing node SEN, which are connected together by switching on the third transistor M3, are pre-charged to the source voltage VCORE. The source voltage VCORE is usually equal to the power supply voltage VDC_PB, but the two voltages are provided by a separate voltage source. During the pre-charging period t1, voltages applied to an addressed word-line WL and the drain and source selection lines DSL and SSL are raised to ensure the conductive path from an addressed bit-line BL to the source line SL depending on cell status.

Just before the first evaluation period t2, a transistor M11 is disabled by lowering the level of voltage SA_DISCH. The first evaluation period t2 starts when the voltage SA_P-RECH is grounded. If the addressed cell is erased, the first node CSO and the sensing node SEN are eventually discharged by a current sunk from the addressed cell. The sensing node SEN and the first node CSO are coupled due to high voltage SA_SENSE driven to the third transistor M3 during the first evaluation period t2.

In the first evaluation period t2, the voltage SA_CSOC of the second transistor M2 ensures that the first node CSO is not discharged below initial bit-line voltage plus a delta by charges provided from the voltage source VCORE. Therefore, the voltage level of bit-line BL is kept constant, which allows bit-line to bit-line interference to be suppressed.

After the first evaluation period t2, strobe signals SA_S-TB_N and SA_ST are enabled in the first strobe period t3. If the first node CSO and the sensing node SEN have been discharged enough by the cell current, a sensing transistor M5 is enabled and the voltage level of the node QS goes high, otherwise data of the sense latch 31 is maintained. If the voltage level of the node QS goes high, it switches off a transistor M6, and current path from the voltage source VCORE to the bit-line BL is blocked, which results in discharge of the bit-lines through the transistor M11 during the recovery period t4. If the voltage level of the node QS is maintained at its original level, i.e. a low level, the transistor M6 is maintained as switched-on and the voltage path from the voltage source VCORE to the bit-line BL maintains the voltage level of the bit-line.

When the first strobe period t3 ends, the recovery period t4 starts. In the recovery period t4, the voltages SA_CSOC and PB_SENSE are raised to have a higher level (e.g. +0.2V), and the voltages SA_PRECH and SA_DISCH are reasserted. Depending on the value on the sense latch 31, some bit-lines read as "erased" are discharged due to the switched-off transistor M6 and current path established through the transistor M11, and all the other bit-lines read as "not erased" are pre-charged again. After the recovery period t4, operations are performed for more precise reading during the second evaluation period t5 and the second strobe period t6.

At the first evaluation period t2, a source bouncing can be high due to a huge current sunk by strongly erased cells. Slightly erased cells, which should be identified as erased but still having in the floating gates thereof more electrons than the strongly erased cells, can be influenced by the high source bouncing caused by strongly erased cells; thereby the conductive path from the bit-line to the source line SL can be blocked for those slightly erased cells. At the second evaluation period t5, the bit-lines for the cells read as erased in the first evaluation period t2 has been already discharged, which results in a low source bouncing. The low source bouncing allows more precise current sensing operations for the remaining cells.

In the page buffer circuit 300, a read current Itrip for each cell is determined as follows. Since the first node CSO and the sensing node SEN were pre-charged to the level of the voltage source VCORE, the minimum cell current to switch the sensing latch 31 is determined by the following equation 1.

$$Itrip = (V_{CSO\_precharge} - V_{CSO\_strobe}) * C_{CSO} / T_{eval} \quad \text{[Equation 1]}$$
$$= (VCORE - (VDC\_PB - Vth\_M5)) *$$
$$C_{CSO} / T_{eval} \sim Vth\_M5 * C_{CSO} / T_{eval}$$

In equation 1, $V_{CSO\_precharge}$ represents a final voltage level of the first node CSO in the pre-charging period t1. $V_{CSO\_strobe}$ represents the voltage level of the first node CSO in the strobe period t3. $C_{CSO}$ represents a parasitic capacitance of the first node CSO and the sensing node SEN coupled together during the read operation. $T_{eval}$ represents a time for evaluation between a falling edge of the voltage SA_PRECH and a rising edge of a voltage SA STB_N, which is sum of the first evaluation period t2 and the first strobe period t3.

Equation 1 takes into account that, in order to turn the sensing transistor M5 on, the first node CSO should be discharged as much as a threshold voltage of the sensing transistor M5, which is the PMOS transistor, during the time for evaluation. Thus, $V_{CSO\_strobe}$ is equal to or less than the power supply voltage VDC_PB minus the source-gate threshold voltage Vth_M5 of the sensing transistor M5 to turn the sensing transistor M5 on.

If it is assumed that the voltage source VCORE equals the power supply voltage VDC_PB, the read current Itrip becomes a function of the source-gate threshold voltage Vth_M5 of the sensing transistor M5. The threshold voltage of a transistor is a function of process parameters and temperature, which is not easily controllable.

Another factor to be considered is that, during the first read operation periods t1 to t3, the current sunk from fully erased cells in parallel could cause a drop on the path from the voltage source VCORE and the page buffer of the other cell. In this case, even if it is assumed that the voltage source VCORE equals the power supply voltage VDC_PB, there will be an actual difference between the voltage source VCORE and the power supply voltage VDC_PB. This difference would affect the equation 1 and additionally cause a variation of the read current Itrip depending on the pattern programmed on the cells of a same word-line.

SUMMARY

Embodiments of the invention are directed to a page buffer circuit and current sensing method which ensures the advantages of a current sensing scheme with the precision and process independency of the voltage sensing scheme. In this condition, not only the read distribution margins can be improved, but it is also possible to lower the read current without taking the risk of compromising the reading reliability due to the read current variation. Lowering the read current can be a key factor to technologies with reduced cell current as 3D or FG with a large number of cells in the same stack.

In an embodiment of the invention, a NAND flash memory comprises a bit-line and a page buffer, the page buffer comprising: a first node; a first switching circuit arranged between the first node and the bit-line and configured to pre-charge the bit-line based on a voltage provided to the first switching circuit during a pre-charging period; a sensing node; a third switching circuit arranged between the first node and the sensing node and configured to discharge the sensing node during an evaluation period, wherein the pre-charging period precedes the evaluation period if the voltage level of the first node is lower than a voltage level associated with a voltage applied to the third switching circuit; and a fourth switching circuit configured to provide a first pre-charging path to the bit-line through the first node and the first switching circuit from a first voltage source during the pre-charging period, wherein the sensing node is charged through a second pre-charging path during the pre-charging period, wherein the second pre-charging path is separated from the first pre-charging path by the third switching circuit during the pre-charging period, and wherein the first node and the sensing node are charged by different voltage sources, respectively.

The NAND flash memory further comprises a second switching circuit configured to prevent the voltage value of the first node from being lower than a voltage value associated with a voltage provided to the second switching unit during an evaluation period.

According to another embodiment of the invention, a method for controlling the page buffer for current sensing operation comprises a pre-charging period, an evaluation period, and a strobe period, wherein voltages provided to each of the first, third, and fourth switching circuits being defined as V1, V3, V4, respectively, comprises raising V4 to a first desired value in the pre-charging period; raising V3 to a second desired value in the pre-charging period, wherein the first desired value is bigger than the second desired value.

BRIEF DESCRIPTION OF THE DRAWINGS

The characteristics and advantages of the disclosure will be apparent from the following description of embodiments thereof given by way of indicative and non-limiting examples with reference to the annexed drawings, in which, FIG. 1A is a block diagram of a conventional NAND flash memory device.

FIG. 1C shows an exemplary structure of respective string and memory cells in the memory cell array of FIG. 1B.

DETAILED DESCRIPTION

Figure 1B:
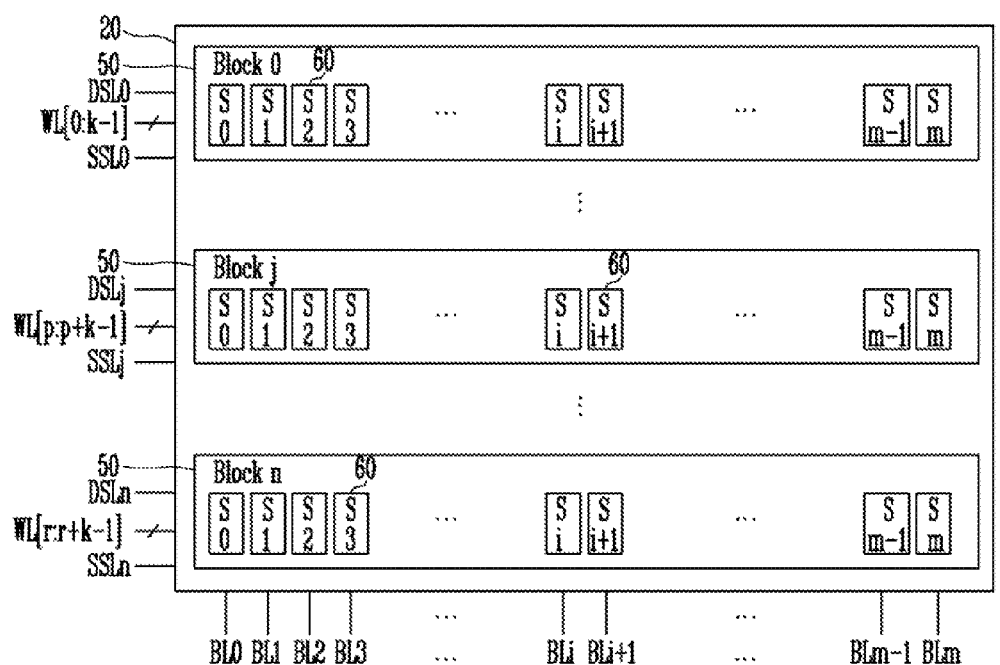
FIG. 1B is an exemplary block diagram of a memory cell array of FIG. 1A.
Figure 2:
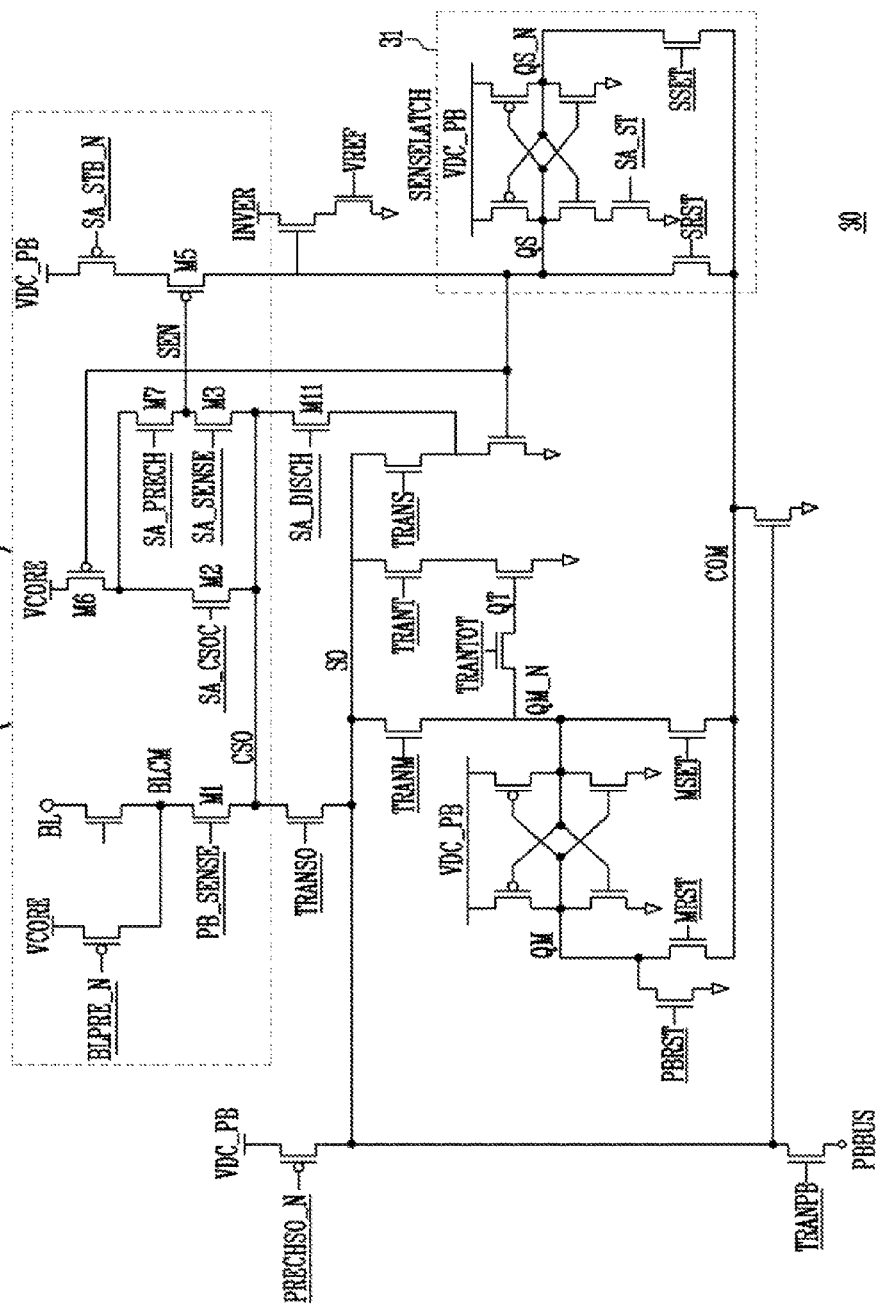
FIG. 2 shows a conventional page buffer circuit suitable to perform a current sensing operation.
Figure 3:
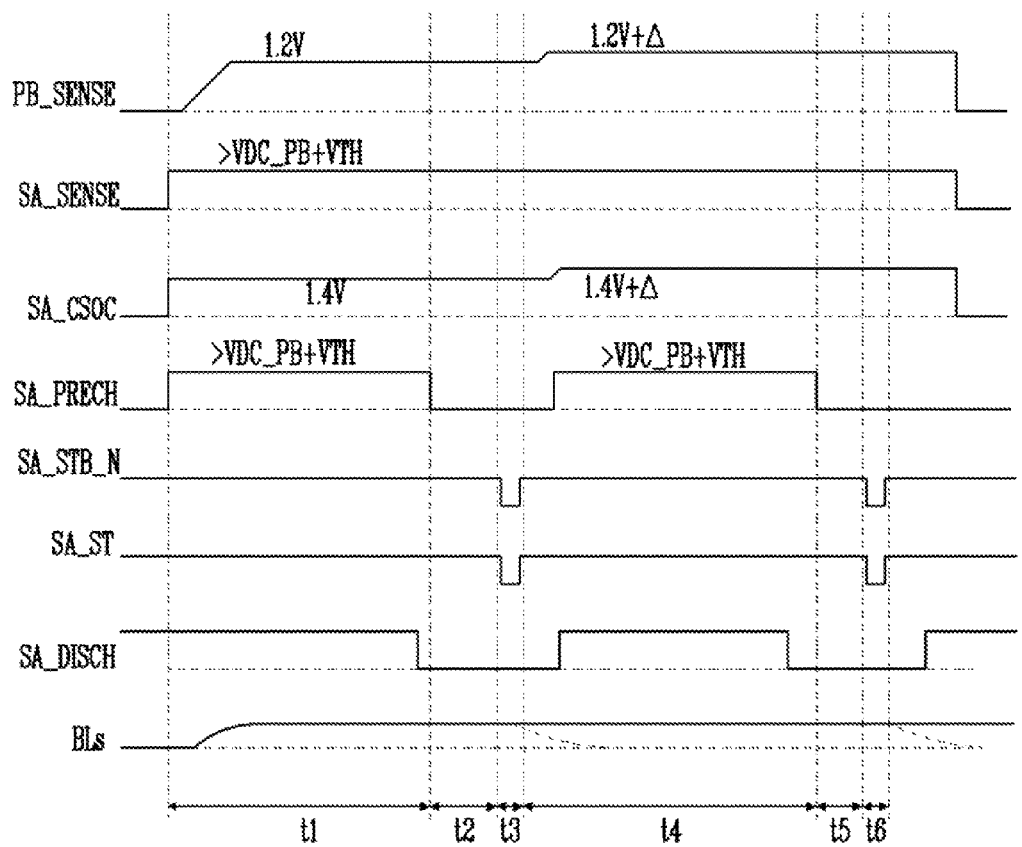
FIG. 3 shows a timing diagram of control sequences for the page buffer circuit of FIG. 2.

Exemplary embodiments of the present invention will be described in detail below with reference to the accompanying drawings. While the present invention is shown and described in connection with exemplary embodiments thereof, it will be apparent to those skilled in the art that various modifications can be made without departing from the spirit and scope of the invention. The terms and words used in the specification and claims should not be construed as their ordinary or dictionary sense. On the basis of the principle that the inventor can define the appropriate concept of a term in order to describe his/her own invention in the best way, it should be construed as a meaning and concepts for complying with the technical idea of the present invention. In addition, detailed descriptions of constructions well known in the art may be omitted to avoid unnecessarily obscuring the gist of the present invention.

In the drawings, corresponding features are identified by the same reference numerals.

Figure 4:
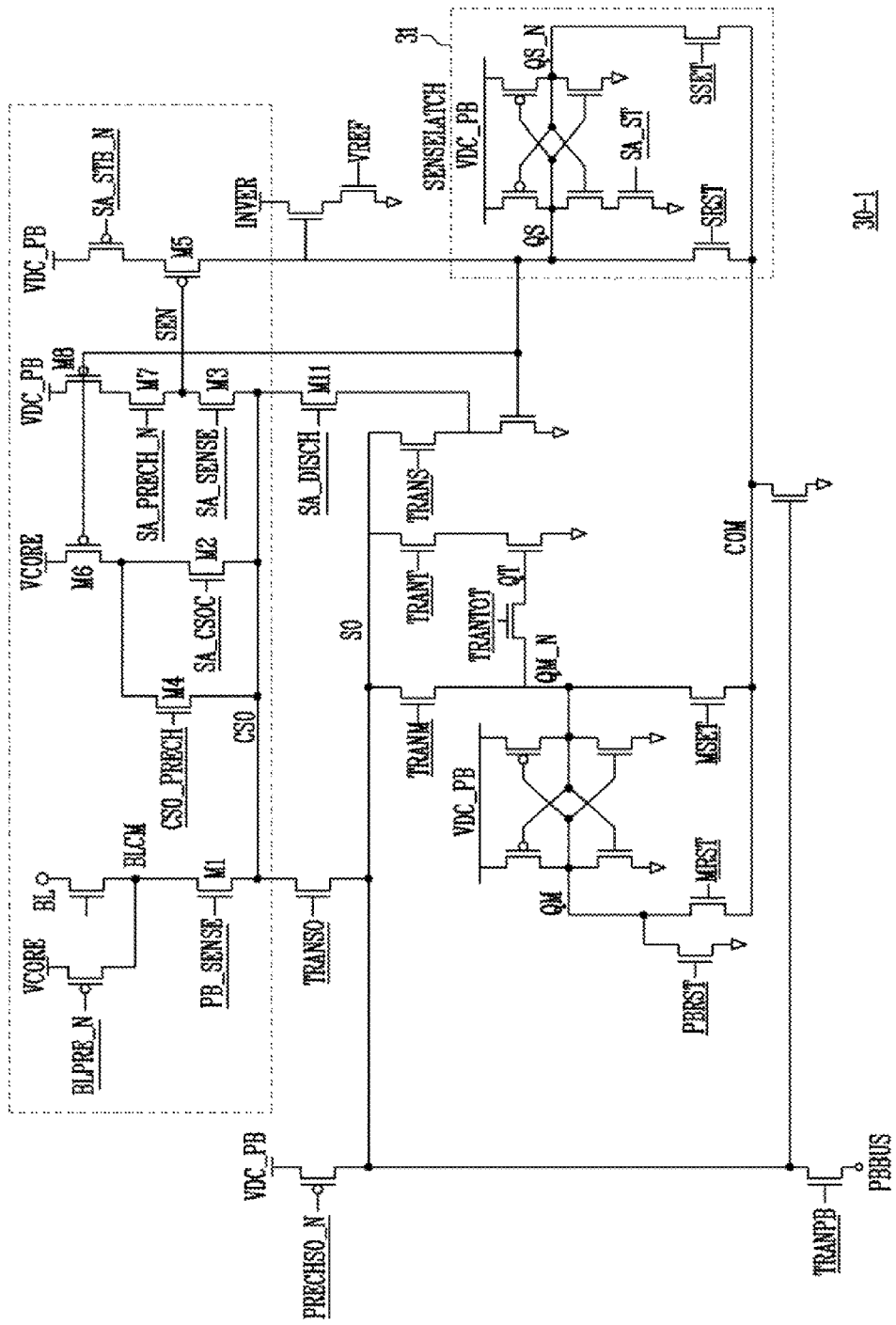
FIG. 4 shows a page buffer circuit, according to a first embodiment of the invention.

FIG. 4 shows a page buffer circuit 30-1 according to a first embodiment of the invention.

The structure of the page buffer circuit 30-1 is briefly illustrated at first, and detailed operation of the page buffer circuit 30-1 will be explained referring to FIG. 5.

The page buffer circuit 30-1 for a NAND flash memory comprises a first node CSO, a first switching circuit M1 arranged between the first node CSO and a corresponding bit-line BL, a second switching circuit M2, a sensing node SEN, a third switching circuit M3 arranged between the first node CSO and the sensing node SEN, a fourth switching circuit M4 configured to provide a first pre-charging path to the bit-line BL through the first node CSO and the first switching circuit M1 from a first voltage source VCORE. In FIG. 4, the first, second, third, and fourth switching circuits M1, M2, M3, and M4 are n-type MOSFETs, but the embodiment is not limited thereto. For convenience, the first, second, third, fourth switching circuits, M1, M2, M3, M4 are denoted first, second, third, fourth transistors, respectively, hereinafter.

The page buffer circuit 30-1 further comprises the first voltage source VCORE, and a second voltage source VDC_PB.

The page buffer circuit 30-1 for a NAND flash memory further comprises a fifth switching circuit M5, which is a PMOS transistor M5, the gate of which is coupled with the sensing node SEN. The fifth transistor M5 is configured to switch on or off a path from the second voltage source VDC_PB to a sense latch 31. The sense latch 31 is configured to receive at its input node QS a drain voltage of the fifth transistor M5. The input node QS of the sense latch 31 is coupled to sixth and eighth switching circuits M6 and M8 to enable or disable current paths from the first and second voltage sources VCORE and VDC_PB to each of the second, third, and fourth transistors M2, M3 and M4 based on the voltage level of the input node QS of the sense latch 31. In the embodiment, the fifth, sixth, seventh and eighth switching circuits M5, M6, M7 and M8 are shown as PMOS transistors, but the embodiment is not limited thereto.

The sixth transistor M6 is arranged between the first voltage source VCORE and the second and fourth transistors M2 and M4. The eighth transistor M8 is arranged between the second voltage source VDC_PB and the seventh transistor M7. The source of the seventh transistor M7 is connected to the eighth transistor M8, and the drain of the seventh transistor M7 is connected to the third transistor M3 at the sensing node SEN.

The first transistor M1 is configured to pre-charge the bit-line BL based on the voltage PB_SENSE provided to the first switching circuit M1 during a pre-charging period. The source of the second transistor M2 is coupled to the first node CSO. The second transistor M2 is configured to prevent the voltage level of the first node CSO from being lower than the voltage SA_CSOC minus the threshold voltage of the second transistor M2 during an evaluation period.

The source of the third transistor M3 is coupled with the first node CSO, and the source of the third transistor M3 is coupled with the sensing node SEN. The third transistor M3 is configured to discharge the sensing node SEN when the voltage level of the first node CSO is lower than a voltage level associated with a voltage applied to the third transistor M3, i.e., a voltage SA_SENSE minus the threshold voltage the third transistor M3, during the evaluation period.

A source of the fourth transistor M4 is electrically coupled with the first node CSO. The fourth transistor M4 is configured to provide a first pre-charging path to the bit-line BL through the first node CSO and the first transistor M1 from the first voltage source VCORE during the pre-charging period. The sensing node SEN is not included in the above first pre-charging path. In other words, the sensing node SEN is isolated from the first node CSO during the pre-charging period. The sensing node SEN is charged through a second pre-charging path during the pre-charging period, and the second pre-charging path is separated from the first pre-charging path by the third transistor M3 during the pre-charging period. In FIG. 4, the second pre-charging path can be formed from the second voltage source VDC_PB through the seventh transistor M7 up to the sensing node SEN. During the pre-charging period, the fourth transistor M4 is configured to raise the voltage level of the first node CSO up to a gate voltage CSO_PRECH of the fourth transistor M4 minus the threshold voltage of the fourth transistor M4. The third transistor M3 is turned off during the pre-charging period to isolate or separate the sensing node SEN from the first node CSO. In other words, the first charging path and the second charging path are separated during the pre-charging period by controlling the third transistor M3.

The pre-charging voltage for the bit-line BL is determined by the voltage PB_SENSE provided to the gate of the first transistor M1 minus the threshold voltage of the first transistor M1.

The sixth transistor M6 is configured to switch current paths from the first voltage source VCORE to the second transistor M2 and the fourth transistor M4 based on the gate voltage of the sixth transistor M6, which is provided from the input node QS of the sense latch 31.

The PMOS seventh transistor M7 is configured to charge the sensing node SEN during the pre-charging period up to the voltage level of the second voltage source VDC_PB by controlling the gate voltage SA_PRECH_N of the seventh transistor M7.

The PMOS eighth transistor M8 is configured to switch a current path from the second voltage source VDC_PB to the seventh transistor M7 and the third transistor M3 based on the gate voltage of the sixth transistor M8, which is provided from the input node QS of the sense latch 31.

Figure 5:
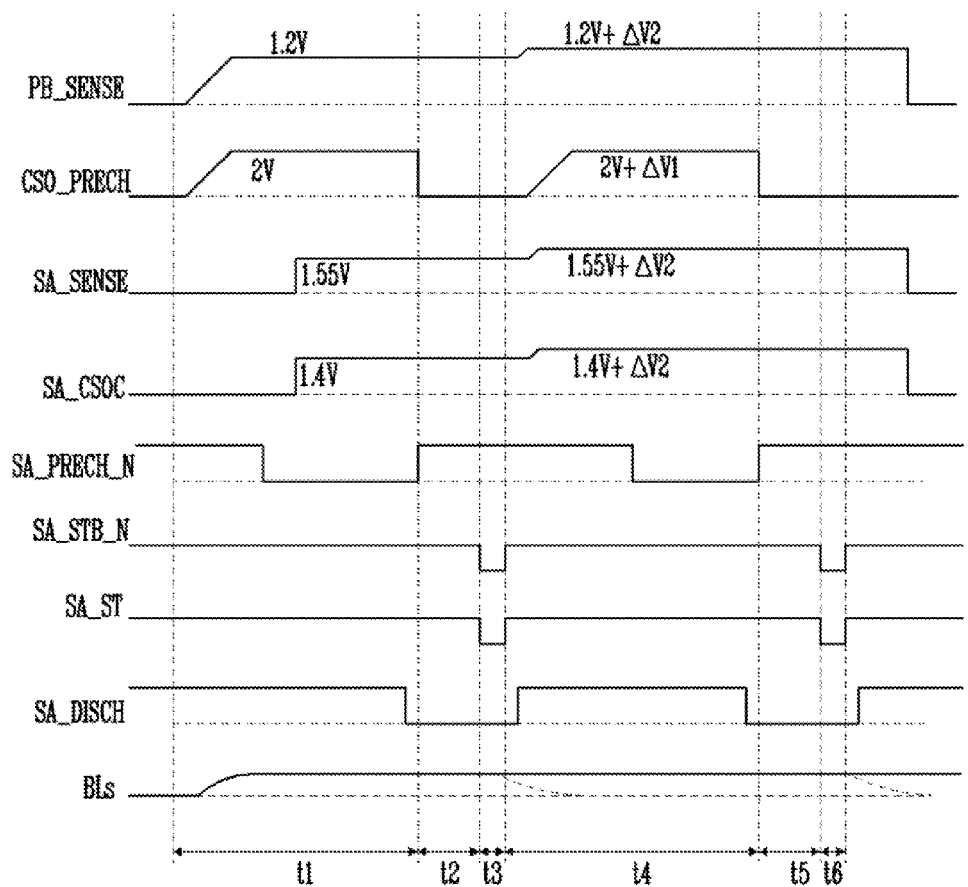
FIG. 5 shows a timing diagram of control sequences for the page buffer circuit of FIG. 4.

FIG. 5 shows a timing diagram illustrating operations of the page buffer circuit 30-1.

The operations comprise first and second read operations. The first read operation is performed during a first read operation time section comprising a pre-charging period t1, a first evaluation period t2, a first strobe period t3. The second read operation is performed during a second read operation time section comprising a recovery period t4, a second evaluation period t5, and a second strobe period t6.

First, when the pre-charging period t1 starts, the sense latch 31 is reset, i.e., the voltage level of the input node QS of the sense latch 31 becomes low. Then, all bit-lines BL0 to BLm are pre-charged at the same time by raising voltage PB_SENSE of the first transistor M1 to the desired bit-line level (e.g. 1.2V) plus a threshold voltage of the first transistor M1. A first pre-charge path to bit-line BL is powered through the fourth transistor M4 by raising the gate voltage CSO_PRECH thereof to a desired voltage (e.g. 2V). These voltages are applied for a sufficient time to pre-charge the bit-lines during the pre-charging period t1. The gate voltage CSO_PRECH of the fourth transistor M4 is controlled such that the final voltage of the first node CSO becomes equal to the voltage CSO_PRECH (e.g. 2V) minus the threshold voltage Vth_M4 of the fourth transistor M4.

The first node CSO and the sensing node SEN are isolated from each other during the pre-charging period t1 by driving the gate voltage SA_SENSE of the third transistor M3 to a low level for some time at the start of the pre-charging period t1.

Before the pre-charge period t1 ends, the gate voltage SA_CSOC of the second transistor M2, the gate voltage SA_SENSE of the third transistor M3, and the gate voltage SA_PRECH_N of the seventh transistor M7 are set to enable the respective second, third and seventh transistors M2, M3, and M7. The voltage SA_CSOC is driven to a voltage level (e.g. 1.4V) a bit higher than the level of the voltage PB_SENSE (e.g., 1.2 V), and the voltage SA_SENSE is driven to a level (e.g. 1.55V) a bit higher than the level of the voltage SA_CSOC (e.g. 1.4 V).

The following voltage condition is met near a final phase of the pre-charging period t1:

CSO_PRECH (e.g. 2V)>SA_SENSE (e.g. 1.55V)>SA_CSOC (e.g. 1.4V)>PB_SENSE (e.g. 1.2V).

In a general form, if the voltages provided to the first, second, third, and fourth switching circuits, M1, M2, M3 and M4, are defined as V1, V2, V3, V4, respectively, during a portion of interval of the pre-charging period t1 the following voltage conditions are met: V4>V3>V2>V1.

The sequences presented in FIG. 5 are optional and can be easily modified without compromising the functionality or modifying the concept of the embodiment.

At the beginning of the pre-charging period t1, one of the third and seventh transistors M3 and M7 which are respectively gated by the voltages SA_SENSE and SA_PRECH_N is disabled, thus preventing a current path from being formed from the second voltage source VDC_PB to the bit-line BL through the sensing node SEN.

After the gate voltage CSO_PRECH of the fourth transistor M4 has reached the desired level (e.g. 2V), the gate voltage SA_PRECH_N of the seventh transistor M7 is grounded and then the gate voltage SA_SENSE of the third transistor M3 is driven to a certain level (e.g. 1.55V) lower than the desired voltage CSO_PRECH (e.g. 2V).

The first node CSO and the sensing node SEN are isolated from each other by driving the voltage CSO_PRECH to a certain level (e.g. 2V) higher than the voltage SA_SENSE (e.g. 1.55V) such that the third transistor M3 is not turned on in the pre-charging period t1.

During the pre-charge period t1, voltages of word-line and source and drain selection lines WL, SSL and DSL may be raised to ensure the conductive path from the bit-line BL to the source line SL depending on cell status. Before the first evaluation period t2, an eleventh transistor M11 is disabled by driving a gate voltage SA_DISCH of the eleventh transistor M11 to a low level. Alternatively, the voltages of the word-line and source and drain selection lines WL, SSL and DSL may be raised before the pre-charge period t1.

When the first evaluation period t2 starts, the gate voltage SA_PRECH_N of the seventh transistor M7 is set at a high level, and the gate voltage CSO_PRECH of the fourth transistor M4 is grounded. When the seventh transistor M7 is a PMOSFET, it is disabled by raising the gate voltage SA_PRECH_N. This can be advantageous over an arrangement wherein the seventh transistor M7 is a NMOSFET because the sensing node SEN is not discharged by the gate transistor coupling effect of the seventh transistor M7 when the seventh transistor M7 is a PMOSFET.

During the first evaluation period t2, the first node CSO is being discharged by the current sunk from the cell. At the start of the first evaluation period t2, the voltage level of the first node CSO is higher than the voltage SA_SENSE minus the threshold voltage of the third transistor M3.

If the voltage of the first node CSO decreases and reaches the voltage SA_SENSE minus the threshold voltage Vth_M3 of the third transistor M3, the third transistor M3 turns on, and the sensing node SEN is discharged through the first node CSO. If the parasitic capacitance of the sensing node SEN is negligible with respect to the parasitic capacitance of the first node CSO, the voltage level of the sensing node SEN immediately reaches the voltage level of the first node CSO after the third transistor M3 is turned on.

If the first node CSO is not discharged at all or the first node CSO is slightly discharged such that its voltage level is above the voltage SA_SENSE minus the threshold voltage Vth_M3 of the third transistor M3, the third transistor M3 does not turn on, and the level of the second voltage source VDC_PB, i.e., the level of the initial voltage charged to the sensing node SEN after the pre-charging period t1, is preserved on the sensing node SEN at the end of the first evaluation period t2.

During the first evaluation phase t2, the gate voltage SA_CSOC of the second transistor M2 may ensure that the first node CSO is not discharged below an initial bit-line voltage BL plus a delta voltage. As a consequence, the voltage of the bit-line BL may be kept constant thereby suppressing the bit-line to bit-line interference in the ABL scheme.

After the first evaluation period t2, the strobe signals SA_STB_N and SA_ST are enabled during the first strobe period t3. Lowering the voltage level of the strobe signal SA_STB_N causes the source of the fifth transistor M5 to be provided with the voltage of the second voltage source VDC_PB. If the sensing node SEN has been discharged, the sensing transistor M5 is enabled, and the voltage level of the input node QS of the sensing latch 31 is raised. Otherwise, the voltage level of the input QS of the sensing latch 31 is maintained.

After the first strobe period t3 ends and the strobe signals SA_STB_N and SA_ST are disabled, the gate voltage SA_SENSE of the third transistor M3, the gate voltage SA_CSOC of the second transistor M2, the gate voltage PB_SENSE of the first transistor M1 are raised to have higher levels by an amount of delta $\Delta V_2$, respectively. Alternatively, the gate voltages SA_SENSE, SA_CSOC, and PB_SENSE may be kept constant without adding the additional amount of delta $\Delta V_2$.

In the recovery period t4, depending on the voltage level of the input node QS of the sense latch 31 of each page buffer 30-1, the bit-lines BL connected to cells read as "erased" are discharged through the discharge path established through the turned on eleventh transistor M11 while a high voltage level of the input node QS turns off the sixth and eighth transistors M6 and M8. All other bit-lines connected to cells read as "not erased" are pre-charged again due to a low voltage level of the input node QS. Afterwards, the second read operation of the second read operation time section comprising the recovery period t4, the second evaluation period t5 and the second strobe period t6 is repeated to more precisely read data with reduced source bouncing.

Figure 6:
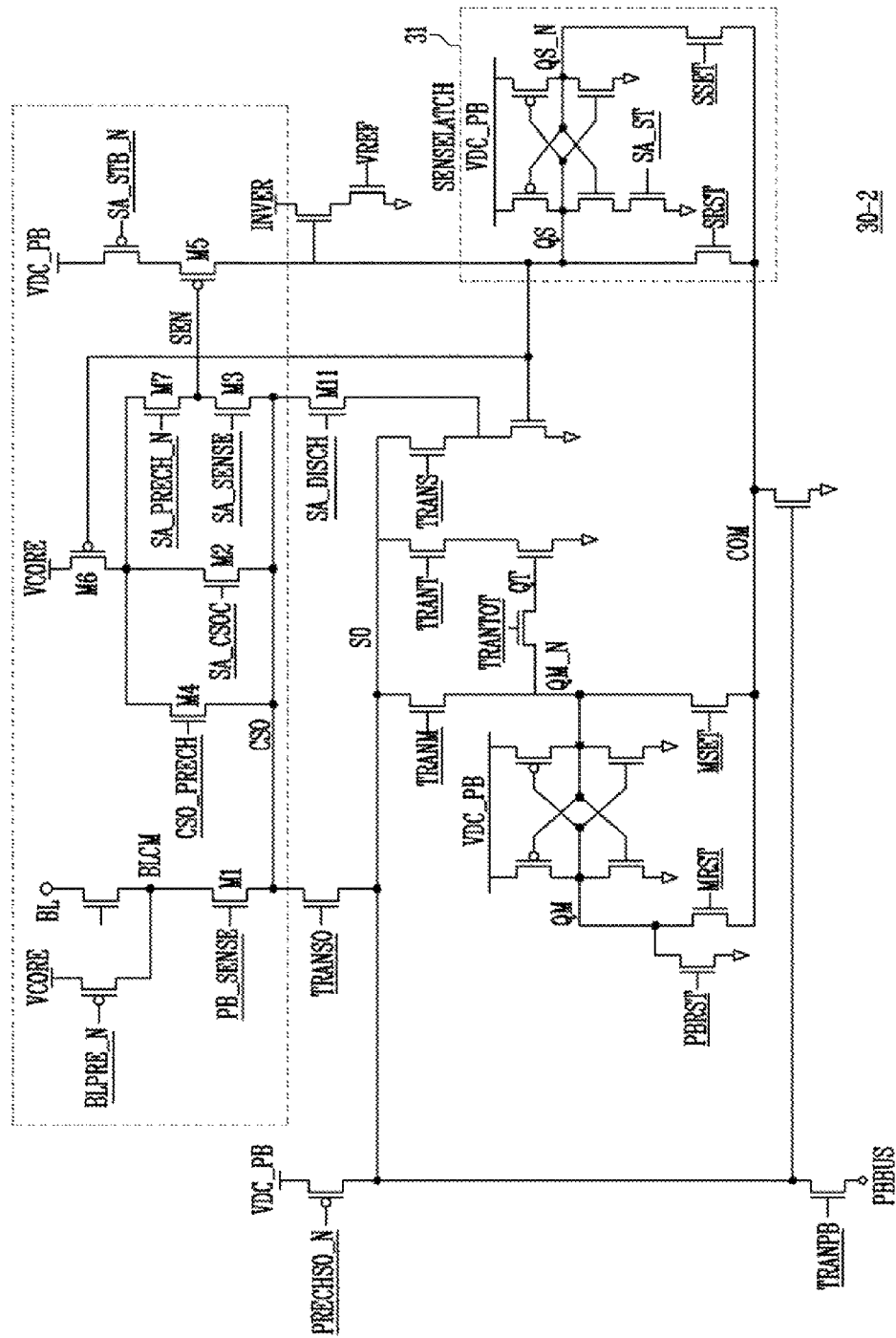
FIG. 6 shows a page buffer circuit according to a second embodiment of the invention.

FIG. 6 shows a page buffer circuit 30-2 according to a second embodiment of the invention.

The difference from the first embodiment of FIG. 4 is that the seventh transistor M7 is coupled with the sixth transistor M6. In other words, the sensing node SEN is charged by the first voltage source VCORE during the pre-charging period t1. The eighth transistor M8 of the first embodiment is not necessary for the second embodiment.

Provided that the sensing node SEN can retain the charge during the first evaluation period t2 even with a very low capacitance value and that the voltage of the first voltage source VCORE is sufficiently high to turn off the fifth transistor M5, the page buffer circuit 30-2 can be used. It does not provide separate pre-charging paths for the sensing node SEN and bit-line BL, but it has the advantage of requiring a reduced number of transistors with a benefit on area reduction.

As seen from the operation of FIG. 5, the condition to flip the sensing latch 31 is satisfied when the sensing node SEN is discharged to the first node CSO. This happens when the cell current discharges the first node CSO to the level of the voltage SA_SENSE minus the threshold voltage Vth_M3 of the third transistor M3. Since the first node CSO has been pre-charged to the level of the voltage CSO_PRECH minus the threshold voltage Vth_M4 of the fourth transistor M4 under the assumption that the parasitic capacitance of the sensing node SEN is negligible respect to the parasitic capacitance of the first node CSO, the read current Itrip can be calculated as the following equation 2:

$$Itrip = (V_{CSO}\_precharge - Vth\_M4 - (V_{SA\_SEN} - Vth\_M3))$$
$$*C_{CSO}/T_{eval}$$
$$= (V_{CSO}\_precharge - V_{SA\_SEN})*C_{CSO}/T_{eval} \quad [\text{Equation 2}]$$

The third transistor M3 and the fourth transistor M4 can be designed and implemented so that their threshold voltages are equal to each other.

As can be observed from equation 2 compared to equation 1 of the prior art, the dependency on the threshold voltage has been eliminated so that the solution guarantees enhanced process and temperature independency.

Moreover, the first and second voltage sources VCORE and VDC_PB are not introduced in equation 2 at least as first order approximation, so the voltage drop of the first voltage source VCORE caused by the source bouncing does not affect equation 2.

With reference to circuit 30-1 of FIG. 4, another advantage is that the bit-line pre-charge path from the first voltage source VCORE through the sixth transistor M6, the fourth transistor M4, and the first transistor M1 is separated from the pre-charge path of the sensing node SEN which is biased by the second voltage source VDC_PB. In this way, any variation to the pre-charge voltage is avoided since no current is drained from the second voltage source VDC_PB to the core matrix.

It also follows from equation 1 of the prior art that the only way to modulate the read current Itrip is to modify the evaluation time $T_{eval}$. Usually, the evaluation time $T_{eval}$ is very short due to the reduced capacitance $C_{CSO}$ of the first node CSO, and thus controlling the evaluation time $T_{eval}$ is not an efficient or easy way to adjust the read current Itrip according to equation 1 of the prior art.

The read current Itrip according to equation 2 of the present disclosure can be more easily modulated to be matched with the desired value by controlling the difference between the final voltage level $V_{CSO}$_precharge of the first node CSO in the pre-charging period t1 and the gate voltage $V_{SA\_SENSE}$ of the third transistor M3. Especially, if analog control voltages of the page buffer 30-2 such as the gate voltages SA_SENSE, SE_CSOC and CSO_PRECH of the third, second and fourth transistors M3, M2 and M4, etc. are all produced by the same voltage regulator and matched to each other, the second embodiment of FIG. 6 provides an effective way to control the read current Itrip tightly.

Moreover, having the sensing node SEN floating for a longer time can be avoided. Since the read current modulation can be performed via modulation of the final voltage level $V_{CSO}$_precharge of the first node CSO in the pre-charging period t1 minus the gate voltage $V_{SA\_SENSE}$ of the third transistor M3, there is no need to increase the evaluation time $T_{eval}$ excessively for reducing the read current Itrip. During the evaluation time $T_{eval}$, the sensing node SEN is floating and may be subject to a transistor leakage which may reduce the voltage level of the sensing node SEN resulting in turning on the fifth transistor M5 erroneously. This leakage establishes a limit to the possibility of setting the desired read current Itrip by controlling evaluation time $T_{eval}$ only. With the voltage setting of the final voltage level $V_{CSO}$_precharge of the first node CSO in the pre-charging period t1 minus the gate voltage $V_{SA\_SENSE}$ of the third transistor M3, this limitation can be overcome.

As stated in the control sequence description of FIG. 5, the first read operation of the first read operation time section t1 to t3 is suitable to sense the cells with high current and to discharge the bit-lines of the cells read as "erased" at the end of the first read operation in order to reduce the current to the source line SL. In case where only a few cells are programmed on the page, the source bouncing could be very low or null also in the first read operation of the first read operation time section t1 to t3 because slightly erased cells could be read during this first read operation, especially if neighbouring cells are strongly erased and are driving a high current. The bit-line to bit-line interference, may be reduced substantially by keeping the bit-line voltage constant by the second transistor M2.

By using a higher voltage difference between the final voltage level $V_{CSO}$_precharge of the first node CSO in the pre-charging period t1 and the gate voltage $V_{SA\_SENSE}$ of the third transistor M3 or a shorter evaluation time $T_{eval}$ during the first read operation, the read current Itrip can be increased with respect to the second read operation of the second read operation time section t4 to t6. In this case, only cells with a high current can be read as "erased" during the first read operation and cells with a lower margin can be read during the second read operation with more precise sensing with reduced source bouncing. Sensing precision can be enhanced in this way.

From the foregoing, it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A NAND flash memory comprising a bit-line and a page buffer, the page buffer comprising:

a first node;
a first switching circuit arranged between the first node and the bit-line and configured to pre-charge the bit-line based on a voltage provided to the first switching circuit during a pre-charging period;
a sensing node;
a third switching circuit arranged between the first node and the sensing node and configured to discharge the sensing node during an evaluation period, wherein the pre-charging period precedes the evaluation period if the voltage level of the first node is lower than a voltage level associated with a voltage applied to the third switching circuit; and
a fourth switching circuit configured to provide a first pre-charging path to the bit-line through the first node and the first switching circuit from a first voltage source during the pre-charging period,
wherein the sensing node is charged through a second pre-charging path during the pre-charging period,
wherein the second pre-charging path is separated from the first pre-charging path by the third switching circuit during the pre-charging period, and
wherein the first node and the sensing node are charged by different voltage sources, respectively.

2. The NAND flash memory of claim 1, wherein the page buffer further comprises a second switching circuit configured to prevent the voltage level of the first node from being lower than a voltage level associated with a voltage provided to the second switching circuit during the evaluation period.

3. The NAND flash memory of claim 1,
wherein the first switching circuit comprises a first NMOS transistor, and
wherein the first node is electrically coupled to a terminal of the first NMOS transistor opposite to the terminal to which the bit-line is electrically coupled.

4. The NAND flash memory of claim 3, wherein a pre-charging voltage of the bit-line is determined by a voltage provided to the gate of the first NMOS transistor minus a threshold voltage of the first NMOS transistor.

5. The NAND flash memory of claim 2,
wherein the second switching circuit comprises a second NMOS transistor, and
wherein a terminal of the second NMOS transistor is electrically coupled to the first node.

6. The NAND flash memory of claim 5, wherein the voltage of the first node is prevented from being lower than the voltage provided to the gate of the second NMOS transistor minus the threshold voltage of the second NMOS transistor during the evaluation period.

7. The NAND flash memory of claim 1,
wherein the third switching circuit comprises a third NMOS transistor, and
wherein the first node is electrically coupled to one terminal of the third NMOS transistor, and the sensing node is electrically coupled to the opposite terminal of the third NMOS transistor.

8. The NAND flash memory of claim 7, wherein the third NMOS transistor is configured to discharge the sensing node when the voltage level of the first node is lower than the gate voltage of the third NMOS transistor minus the threshold voltage of the third NMOS transistor during the evaluation period.

9. The NAND flash memory of claim 1,
wherein the fourth switching circuit comprises a fourth NMOS transistor, and
wherein one terminal of the fourth NMOS transistor is electrically coupled with the first node.

10. The NAND flash memory of claim 1, wherein the fourth NMOS transistor is configured to raise the voltage of the first node up to the gate voltage of the fourth NMOS transistor minus the threshold voltage of the fourth NMOS transistor during the pre-charging period.

11. The NAND flash memory of claim 1, the page buffer further comprising:
a second voltage source;
a sense latch; and
a fifth switching circuit coupled with the sensing node and configured to switch a path from the second voltage source to the sense latch,
wherein the sense latch is configured to receive at its input node a voltage based on the voltage outputted from the fifth switching circuit, and to enable or disable current paths from the first and second voltage sources to the second, third, and fourth switching circuits based on a voltage level of the input node.

12. The NAND flash memory of claim 11,
wherein the fifth switching circuit comprises a fifth PMOS transistor, and
wherein the sensing node is electrically coupled to a gate of the PMOS transistor, and one terminal of the fifth PMOS transistor is electrically coupled to the input node.

13. The NAND flash memory of claim 12, wherein the page buffer further comprises a sixth switching circuit configured to switch the current paths from the first voltage source to the second and fourth switching circuits based on the voltage level of the input node.

14. The NAND flash memory of claim 13,
wherein the sixth switching circuit comprises a sixth PMOS transistor, and
wherein a gate of the sixth PMOS transistor is electrically coupled with the input node.

15. The NAND flash memory of claim 11, wherein the page buffer further comprises a seventh switching circuit configured to charge the sensing node during the pre-charging period up to the voltage level of the second voltage source.

16. The NAND flash memory of claim 15,
wherein the seventh switching circuit comprises a seventh PMOS transistor, and
wherein the gate voltage of the seventh PMOS transistor is controlled to pre-charge the sensing node.

17. The NAND flash memory of claim 11, wherein the page buffer further comprises a eighth switching circuit configured to switch the current path from the second voltage source to the sensing node based on the voltage level of the input node.

18. The NAND flash memory of claim 17,
wherein the eighth switching circuit comprises an eighth PMOS transistor, and
wherein a gate of the eighth PMOS transistor is electrically coupled with the input node.

19. The NAND flash memory of claim 1, wherein during a portion of Interval of the pre-charging period the following conditions are met when the voltages provided to each of the first, second, third, and fourth switching circuits are defined as V1, V2, V3, V4, respectively: V4>V3>V2>V1.

20. The NAND flash memory of claim 19, wherein read current is configured to be modulated by controlling the difference of the voltages provided to the fourth and third switching circuits V4 and V3.

* * * * *